(12) United States Patent
Yamada

(10) Patent No.: US 7,531,954 B2
(45) Date of Patent: May 12, 2009

(54) DISPLAY PANEL, DISPLAY DEVICE, AND DISPLAY MODULE OF MOVABLE BODY

(75) Inventor: Tadashi Yamada, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 426 days.

(21) Appl. No.: 11/336,765

(22) Filed: Jan. 23, 2006

(65) Prior Publication Data
US 2006/0192496 A1   Aug. 31, 2006

(30) Foreign Application Priority Data
Feb. 25, 2005   (JP)   ............... 2005-050326

(51) Int. Cl.
*G09G 3/00*   (2006.01)
(52) U.S. Cl. .................... 313/498; 313/500
(58) Field of Classification Search ............. 315/169.3, 315/169.1, 169.2, 169.4; 257/52, 49, 66, 257/72, 79, 59; 313/495, 498, 499, 500
See application file for complete search history.

(56) References Cited
U.S. PATENT DOCUMENTS
2006/0118790 A1 * 6/2006 Park et al. .................... 257/72

FOREIGN PATENT DOCUMENTS

| JP | A-2002-287663 | 10/2002 |
| JP | A-2004-127924 | 4/2004 |
| KR | 2002-0077136 | 10/2002 |

\* cited by examiner

*Primary Examiner*—David Hung Vu
(74) *Attorney, Agent, or Firm*—Oliff & Berridge, PLC

(57) ABSTRACT

A display panel includes a light-emitting element substrate provided with a plurality of pixels that are arranged in a matrix corresponding to intersections of a plurality of scanning lines and a plurality of data lines, a light-emitting element provided at each of the pixels that is driven on the basis of image data of each of the pixels, and a power supply line pad and a data line pad that are disposed on the light-emitting element substrate in a two-dimensional manner, the power supply line pad being provided with terminals of a plurality of power supply lines that supply the power to the pixels and the data line pad being provided with terminals of the plurality of data lines.

10 Claims, 9 Drawing Sheets

DISPLAY PANEL, DISPLAY DEVICE, AND DISPLAY MODULE OF MOVABLE BODY

BACKGROUND

1. Technical Field

The present invention relates to a display panel, such as an organic EL panel, to a display device, and to a display module of a movable body.

2. Related Art

In recent years, an organic EL panel using an organic electroluminescent (hereinafter, referred to as 'EL') element has been drawing attention in that it is better than other devices due to the low power consumption, a wide viewing angle, and a high contrast ratio thereof. As an example of the organic EL display device using the organic EL panel, JP-A-2004-127924 discloses an electronic module in which an organic EL panel and a flexible wiring substrate connected to the organic EL panel are included and in which a driver IC is mounted on the flexible wiring substrate and an organic EL element located at each of a plurality of pixels is driven by the driver IC (See FIG. 14 in JP-A-2004-127924). In the organic EL display device of the related art, a data line pad serving as a connection terminal part for a plurality of data lines and a power supply line pad serving as a connection terminal part for a plurality of power supply lines are disposed in a single horizontal line on a light-emitting element substrate of the organic EL panel.

In a liquid crystal display device of which the drive principle is different from that of the organic EL display device, it is not necessary to supply a driving current to liquid crystal provided at each pixel, and thus the number of terminals for power supply decreases. Specifically, since it is sufficient to supply a current having an intensity of several tens of milli-ampere to a gate of a thin film transistor (TFT) provided at each pixel and to provide one power supply line or several power supply lines on an element substrate of a liquid crystal panel, it is possible to realize an arrangement in which one or several power supply lines are located between signal lines. That is, it is possible to form a terminal of the one power supply line or terminals of several power supply lines between signal lines, on the same pad as terminals of a plurality of signal lines are formed.

In contrast, in the organic EL display device disclosed in JP-A-2004-127924, it is necessary to supply a current having an intensity of several ampere, for example, one to two ampere, to the organic EL element of each pixel while the organic EL element emits light. In order to supply such a large current to the organic EL element of each pixel, a plurality of power supply lines for supplying the power to each pixel circuit needs to be provided on the light-emitting element substrate of the organic EL panel. In reality, the power supply lines connected to each pixel circuit are thick strip-shaped power supply lines provided individually for each pixel of R (red), G (green), and B (blue), and the total number of power supply lines is 20 to 30 for each pixel of R, G, and B (20 to 30×3) and a ground line (1). As such, in the organic EL display device, four kinds of power supply lines, which are the power supply lines for each pixel of R, G, and B, and the ground line, are needed. In addition, it is necessary to provide 20 to 30 power supply lines or one thick strip-shaped power supply line for each pixel of R, G, and B.

However, in the organic EL display device of the related art disclosed in JP-A-2004-127924, when the data line pad and the power supply line pad of the organic EL panel are electrically connected to a terminal part of the flexible wiring substrate, an adhesive with an anisotropic conductive film is attached onto each of the pads and the terminal part of the flexible wiring substrate is thermally pressed onto each of the pads with the adhesive with the anisotropic conductive film interposed therebetween. For the pitch between terminals (width between the centers of terminals) in the connection terminal parts, such as the data line pad or the power supply line pad, 40 to 60 µm is a mounting limit of the terminals that are typically mounted. The pitch of 40 to 60 µm is the pitch limit in the manufacturing technology when the position deviation of terminals during the thermal pressing is considered. As in the organic EL display device of the related art, in the configuration in which the data line pad and the power supply line pad are disposed in the single horizontal line, for example, in an organic EL display device having a high resolution of 128 ppi, a plurality of data lines are densely provided, whereby it is difficult to dispose a plurality of power supply lines among the plurality of data lines. Further, the higher the resolution of the organic EL panel of the organic EL display device, the narrower the pitch between data line pads (data line pad pitch), as shown by a curve 600 on the graph in FIG. 12. In the graph, the horizontal axis corresponds to the resolution of the organic EL panel (OLED panel resolution), and the vertical axis corresponds to the pitch between data line pads. Furthermore, as the brightness of the organic EL panel is higher, it is necessary to supply a larger current to the organic EL element. Accordingly, it is necessary to make thicker the thick strip-shaped power supply line provided at each pixel of R, G, and B.

As such, the higher the resolution and the brightness of the organic EL panel, the higher in difficulty to dispose the plurality of power supply lines among the plurality of data lines. In addition, since there is the mounting limit in the terminals to be mounted, there has been problems in that the ratio of a display area to the panel size in the direction where a plurality of data lines are disposed is small and a non-display area, that is, a frame portion is large. These problems are not limited to the organic EL display device but affect a display panel using a self-luminous light-emitting element.

SUMMARY

An advantage of some aspects of the invention is that it provides a display panel which has high resolution and high brightness and in which the ratio of a display area to the panel size is large, a display device, and a display module of a movable body.

According to an aspect of the invention, a display panel includes a light-emitting element substrate provided with a plurality of pixels that are arranged in a matrix corresponding to intersections of a plurality of scanning lines and a plurality of data lines. A light-emitting element provided at each of the pixels is driven on the basis of image data of each of the pixels. A power supply line pad and a data line pad are disposed on the light-emitting element substrate in a two-dimensional manner, the power supply line pad being provided with terminals of a plurality of power supply lines that supply the power to the pixels and the data line pad being provided with terminals of the plurality of data lines.

In general, the higher the resolution of the display panel, the narrower the pitch between the data lines, such that it becomes difficult to dispose the plurality of power supply lines supplying the power to each pixel on the light-emitting element substrate. Further, as the brightness of each light-emitting element is higher, it is necessary to make a larger current flow through the light-emitting element. In order to do so, the current capacitance of each power supply line needs to be large, which makes it even more difficult to dispose the plurality of power supply lines on the light-emitting element substrate. For example, in an organic EL panel using an organic EL element as a light-emitting element, four kinds of power supply lines, which are power supply lines for pixels of R, G, and B and a ground line, are needed, and it is necessary to make the current having an intensity of several ampere flow through the organic EL element of each pixel during the emission. For this reason, it is necessary to assign a plurality of power supply lines or a thick strip-shaped power supply line for each pixel of R, G, and B. As a result, the higher the resolution of the display panel, the narrower the pitch between the data lines, such that it becomes difficult to dispose the plurality of power supply lines on the light-emitting element substrate. In addition, as the brightness of a liquid crystal panel is higher, it is necessary to make the larger current flow through the organic EL element. In order to do so, it is necessary to make the thick strip-shaped power supply line provided individually for each pixel of R, G, and B thicker or to increase the number of power supply lines assigned for each pixel, which makes it difficult to dispose the plurality of power supply lines on the light-emitting element substrate.

According to the invention, two kinds of pads, which are the power supply line pad and the data line pad, are not horizontally disposed side-by-side but disposed in a two-dimensional manner, so that it is possible to increase the number of data lines by making the data line pad long as compared with a case in which those two kinds of pads are horizontally disposed side-by-side. Further, in the case in which one thick strip-shaped power supply line is assigned for each pixel, it is possible to make the power supply line provided for each pixel thicker, and in the case in which the plurality of power supply lines is assigned for each pixel, it is possible to increase the number of power supply lines.

Further, by increasing the number of data lines, it is possible to improve the resolution due to an increased number of pixels, to make large the ratio of display area to the panel size in the direction in which the data lines are arranged, and to make the width (so-called frame width) of the non-display area narrow. By making the width of the non-display area narrow, for example, in the case in which a plurality of display panels are disposed such that adjacent non-display areas of the display panels overlap each other and different images, such as an image of a speedometer, an image of a tachometer, or a map image of a navigation device in the vehicle, are displayed by the plurality of display panels, it is possible to perform display close to the display obtained by a typical meter. In addition, since it is possible to increase the number of power supply lines or make the power supply line thick, it is possible to realize the display panel with high brightness. Accordingly, it is possible to realize the high-resolution display panel which has high brightness and in which the ratio of a display area to the panel size is large.

In the display panel, it is preferable that the power supply line pad be disposed apart from the data line pad in the direction perpendicular to the lateral direction of the data line pad. According to the invention, it is possible to make the data line pad extend as long as possible, so that it is possible to further increase the resolution and the brightness.

Further, in the display panel, preferably, a sealing substrate connected to the light-emitting element substrate is further included to seal the plurality of pixels, and the data line pad is formed on the light-emitting element substrate by using the entire area between left and right sealing areas, each having a width necessary for the sealing substrate. According to the invention, since the power supply line pad is not provided between the data line pads, it is possible to make the data line pad long by using the entire area between the left and right sealing areas, each having a width necessary for the sealing substrate, on the light-emitting element substrate, and as a result, it is possible to further increase the resolution and the brightness.

Furthermore, in the display panel, preferably, the plurality of data lines is divided into a plurality of blocks to be driven, and the power supply line pad and the data line pad are provided for each of the plurality of blocks. According to the invention, even when the plurality of data lines are divided into the plurality of blocks to be driven in a high-resolution display panel, it is possible to realize the high-resolution display panel which has high brightness and in which the ratio of a display area to the panel size is large.

According to another aspect of the invention, a display device includes a display panel having a light-emitting element substrate provided with a plurality of pixels that are arranged in a matrix corresponding to intersections of a plurality of scanning lines and a plurality of data lines; a light-emitting element provided at each of the pixels that is driven on the basis of image data of each of the pixels; and a power supply line pad and a data line pad that are disposed on the light-emitting element substrate in a two-dimensional manner, the power supply line pad being provided with terminals of a plurality of power supply lines that supply the power to the pixels and the data line pad being provided with terminals of the plurality of data lines; and a driver IC that drives the plurality of data lines which are mounted on the data line pad. An output-side terminal part of a flexible wiring substrate for power supply is electrically connected to the power supply line pad, and the flexible wiring substrate for power supply is provided with a plurality of power supply lines that supply the power to the respective pixels. An output-side terminal part of a flexible wiring substrate for data is electrically connected to the data line pad, and the flexible wiring substrate for data is provided with a plurality of wiring lines that supply driving signals to the plurality of data lines.

According to the invention, two kinds of pads, which are the power supply line pad and the data line pad, are disposed in a two-dimensional manner, so that it is possible to increase the number of data lines by making the data line pad long as compared with a case when the two kinds of pads are horizontally disposed side-by-side. Further, in the case in which one thick strip-shaped power supply line is assigned for each pixel, it is possible to make the power supply line provided for each pixel thicker, and in the case in which the plurality of power supply lines is assigned for each pixel, it is possible to increase the number of power supply lines. Thereby, it is possible to realize the high-resolution display panel which has high brightness and in which the ratio of a display area to the panel size is large.

Further, in the invention, it is preferable that the flexible wiring substrate for power supply and the flexible wiring substrate for data be disposed to overlap each other. According to the invention, assuming that the flexible wiring substrate for power supply and the flexible wiring substrate for data disposed to overlap each other are one set of wiring substrates, in a case of increasing a number of blocks into which the plurality of data lines is divided in the high-resolution display panel, the sets of wiring substrates corresponding to the number of blocks can be disposed on the light-emitting element substrate to be connected thereto. Thereby, even when a plurality of sets of the flexible wiring substrates for power supply and the flexible wiring substrates for data are provided, it is possible to realize the high-resolution display panel in which the wiring substrates are disposed in a compact manner.

Furthermore, in the invention, preferably, one of the flexible wiring substrate for power supply and the flexible wiring substrate for data is shorter than the other flexible wiring substrate, the one flexible wiring substrate being positioned at the upper side with respect to the light-emitting element substrate. According to the invention, when the one flexible wiring substrate positioned at the upper side with respect to the light-emitting element substrate is bent, the original length thereof is maintained, but when the other flexible wiring substrate positioned at the lower side with respect to the light-emitting element substrate is bent, the other flexible wiring substrate slightly expands. Thereby, even though the mounting location or the connector location deviates a little, the deviation can be absorbed by the expansion. As a result, it becomes easy to perform an operation of manufacturing the flexible wiring substrate for power supply or the flexible wiring substrate for data, or an operation of mounting the flexible wiring substrate for power supply or the flexible wiring substrate for data on the light-emitting element substrate, and the yield ratio of products is improved.

Further, in the invention, preferably, the plurality of power supply lines is supplied with power from an input-side terminal part of the flexible wiring substrate for power supply and an input-side terminal part of the flexible wiring substrate for data, and the input-side terminal part of the flexible wiring substrate for power supply and the input-side terminal part of the flexible wiring substrate for data are connected to different surfaces of a panel control substrate provided with a panel control circuit, respectively, the panel control circuit supplying the plurality of wiring lines with a driving signal corresponding to image data of each of the pixels. According to the invention, since it is possible to connect the input-side terminal part of the flexible wiring substrate for power supply and the input-side terminal part of the flexible wiring substrate for data to the different surfaces of the panel control substrate, the connection operation can be easy. For example, connectors are provided on upper and lower surfaces of the panel control substrate, respectively, and then the input-side terminal part of the flexible wiring substrate for power supply is inserted to one of the connectors and the input-side terminal part of the flexible wiring substrate for data is inserted to the other connector provided on a surface opposite to a surface on which the one connector is provided, which improves the working efficiency of inserting the input-side terminal part of each flexible wiring substrate to each connector.

Furthermore, according to still another aspect of the invention, a display module of a movable body includes a plurality of the display panels described above, and adjacent panels of the plurality of display panels are disposed such that non-display areas around the periphery of display areas of the adjacent display panels overlap each other in plan view, each of the display areas being arranged with a plurality of pixels each having an electroluminescent element in a two-dimensional manner. According to the invention, by using the plurality of display panels in which the widths of the non-display areas can be narrow, in the case in which the plurality of display panels is disposed such that the non-display areas of the adjacent display panels overlap each other in plan view, and different images, such as an image of a speedometer, an image of a tachometer, or a map image of a navigation device in the vehicle, are displayed by the plurality of display panels, it is possible to perform display close to the display obtained by a typical meter. In addition, with each of the plurality of display panels, it is possible to realize the display module of the movable body in which the ratio of a display area to the panel size is large and the display having the high brightness can be performed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
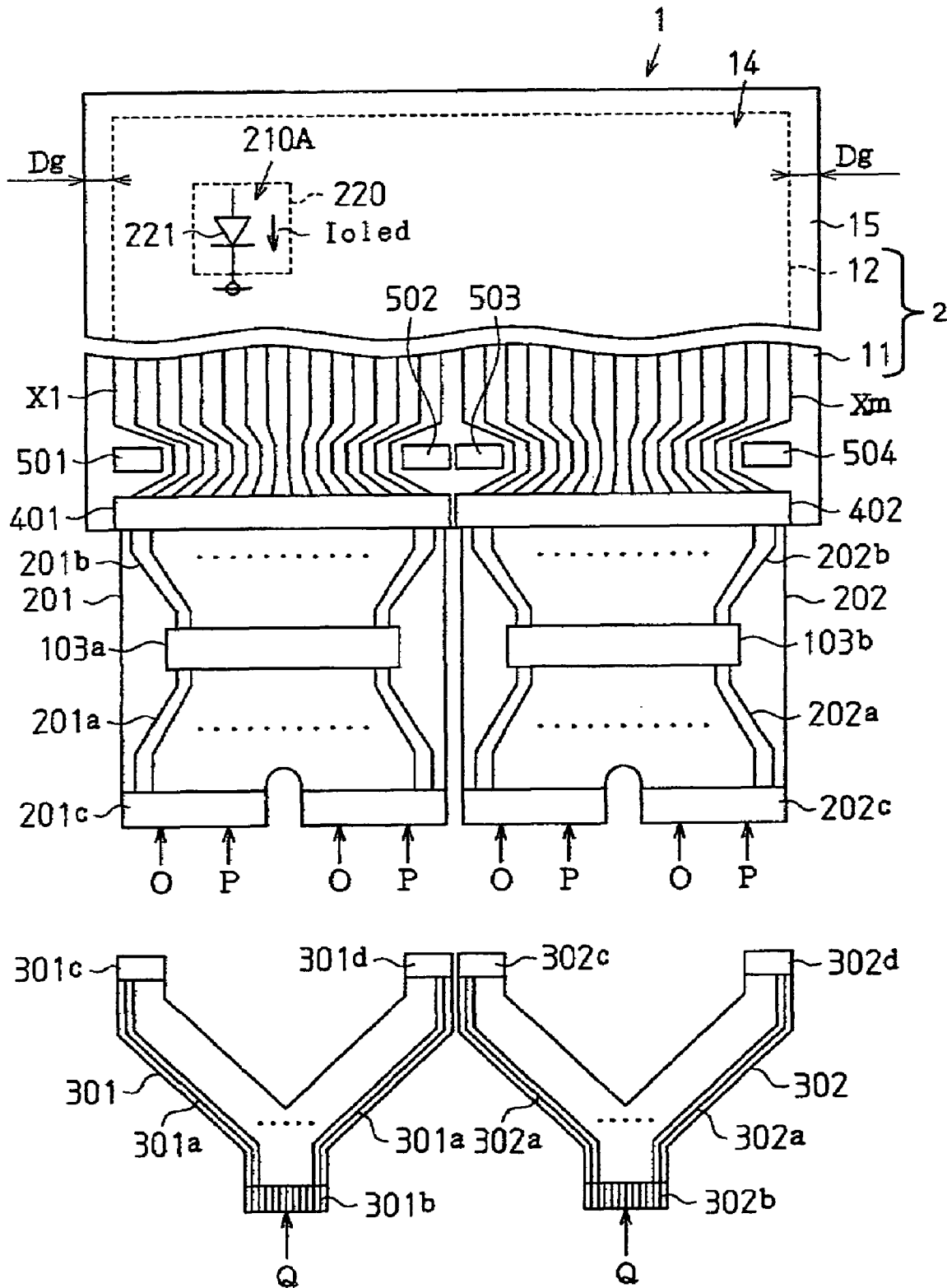
FIG. 1 is an exploded plan view illustrating a part of an organic EL display device according to a first embodiment of the invention.

Hereinafter, preferred embodiments of the invention will be described with reference to the accompanying drawings. In addition, the same elements in the embodiments are denoted by the same reference numerals, and detailed explanation thereof will not be repeated.

First Embodiment

A display panel and a display device using the display panel according to a first embodiment will be described with reference to FIGS. 1 to 4.

Figure 2:
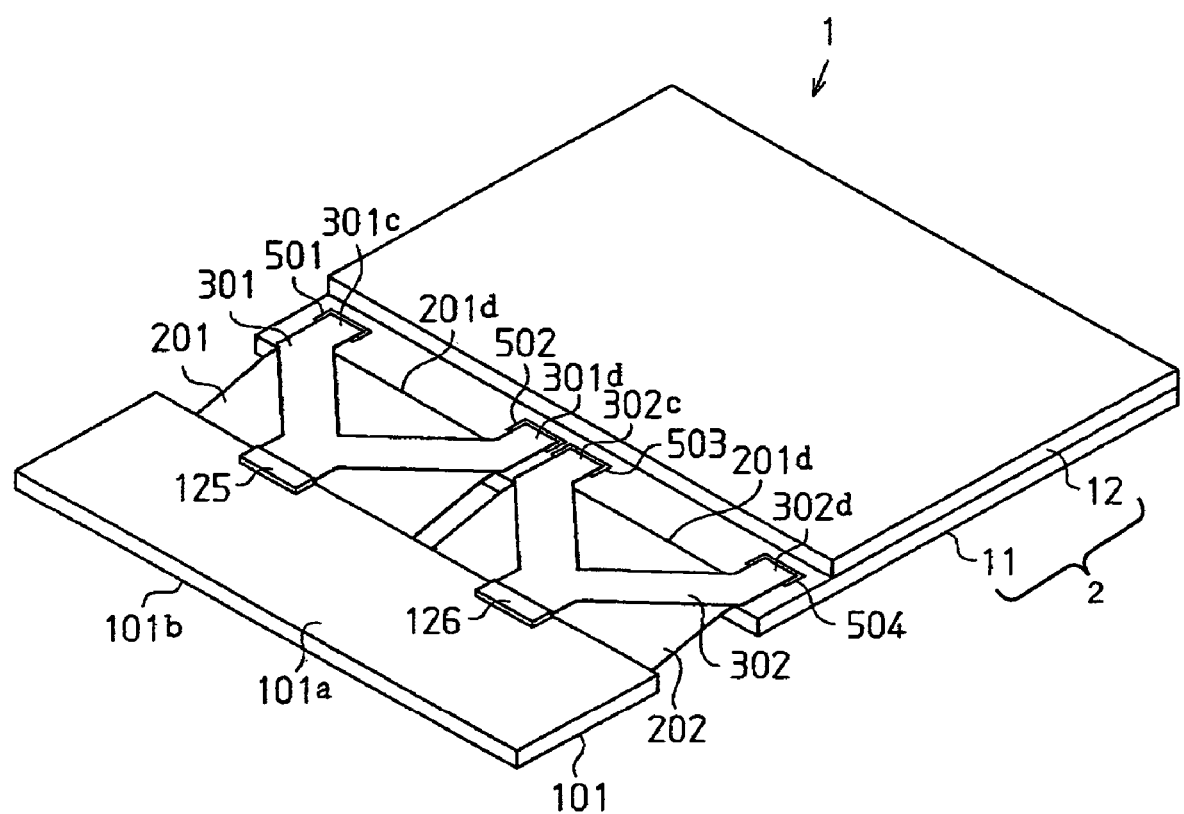
FIG. 2 is a perspective view illustrating the organic EL display device.

The display device according to the first embodiment is an organic EL display device 1 using an organic EL panel 2 as a display panel. As shown in FIGS. 1 and 2, the organic EL panel 2 includes a light-emitting element substrate 11 on which a plurality of pixels 210A are arranged in a matrix, and a sealing substrate 12 connected to the light-emitting element substrate 11 so as to seal the plurality of pixels 210A, each of the plurality of pixels 210A having an organic EL element 221, which is an electroluminescent element, as a self-luminous light-emitting element. In the organic EL panel 2, the organic EL element 221 of each pixel 210A is driven on the basis of image data of each pixel 210A. In FIG. 1, reference numeral 14 indicates a display area in which the plurality of pixels 210A are arranged in a matrix, and reference numeral 15 indicates a so-called frame (non-display area).

Even though not shown in FIG. 1, on the light-emitting element substrate 11, pixel electrodes each having a rectangular shape and serves as an anode are formed in a matrix. On each of the pixel electrodes, for example, a hole injection/transport layer, and a light-emitting layer are sequentially stacked, and a cathode is formed on approximately the entire surface of the substrate formed with the light-emitting layer. In addition, a thin film transistor (TFT), etc. is electrically connected to each of the pixel electrodes. Each of the pixel electrodes, and the hole injection/transport layer, the light-emitting layer, and the cathode, sequentially formed thereon, constitute the organic EL elements 221 of each pixel 210A. Moreover, only one of the plurality of pixels 210A is shown in FIG. 1.

Further, on the light-emitting element substrate 11, power supply line pads 501 to 504, which are formed with terminals of a plurality of power supply lines each supplying power to a pixel circuit 220 of each pixel 210A, and data line pads 401 and 402 to which terminals of a plurality of data lines X1 to Xm are connected, are disposed in a two-dimensional manner. The data line pads 401 and 402 are horizontally disposed side-by-side at an end portion (lower end portion in FIG. 1) on the mounting side of the light-emitting element substrate 11, and the power supply line pads 501 to 504 are disposed more backward than the data line pads 401 and 402 as seen from the end portion on the mounting side of the light-emitting element substrate 11.

That is, the power supply line pads 501 to 504 are not disposed between the data line pads 401 and 402 but disposed apart from the data line pads 401 and 402 and in the direction perpendicular to the lateral direction (left and right direction in FIG. 1) of the data line pads 401 and 402. Accordingly, since the power supply line pads 501 to 504 are not provided at the end portion on the mounting side of the light-emitting element substrate 11 on which the data line pads 401 and 402 are disposed, the data line pads 401 and 402 are formed on the light-emitting element substrate 11 by using the entire area (except for the left and right sealing areas) between the left and right sealing areas, each having a width Dg (width necessary for gas barrier) necessary for the sealing substrate 12.

Further, in the organic EL panel 2, the plurality of data lines X1 to Xm are divided into a plurality of blocks, in this example, two blocks, to be driven. That is, the organic EL elements 221 of 'm' pixels 210A located at each row are divided into two blocks to be driven. For this reason, the power supply line pads 501 to 504 and the data line pads 401 and 402 are provided for each block. Specifically, the data line pad 401 and the two power supply line pads 501 and 502 are provided for a first block, and the data line pad 402 and the two power supply line pads 503 and 504 are provided for a second block.

Among the power supply lines provided for each block, there is a power supply line which is connected to a power source or a ground line inside the panel.

The power supply line pads 501 and 502 are located more backward than the data line pad 401 as seen from the end portion on the mounting side of the light-emitting element substrate 11 and are disposed at locations corresponding to both end portions of the data line pad 401, respectively. In addition, the power supply line pads 503 and 504 are located more backward than the data line pad 402 as seen from the end portion on the mounting side of the light-emitting element substrate 11 and are disposed at locations corresponding to both end portions of the data line pad 402, respectively (see FIG. 1).

The data line pad 401 is formed with terminals of data lines X1 to X(m/2) in the first block. The data line pad 402 is formed with terminals of data lines X(m/2+1) to Xm in the second block. That is, each of the data line pads 401 and 402 is formed with terminals of 'm/2' data lines.

The power supply line pad 501 is formed with terminals of four power supply lines composed of three power supply lines and a ground line, the three power supply lines being connected to a power supply line of the pixel circuit 220 for each pixel 210A of R, G, and B included in 'm/4' pixels 210A corresponding to the data lines X1 to X(m/4), which is the half of the data lines X1 to X(m/2) in the first block, in each row. It is possible to use only one power supply line without using the three power supply lines for R, G, and B. In addition, the four power supply lines each have thick strip shapes.

The power supply line pad 502 is formed with terminals of four power supply lines composed of three power supply lines and a ground line, the three power supply lines being connected to a power supply line of the pixel circuit 220 for each pixel 210A of R, G, and B included in 'm/4' pixels 210A corresponding to the data lines X(m/4+1) to X(m/2), which is the other half of the data lines X1 to X(m/2) in the first block, in each row.

The power supply line pad 503 is formed with terminals of four power supply lines composed of three power supply lines and a ground line, the three power supply lines being connected to a power supply line of the pixel circuit 220 for each pixel 210A of R, G, and B included in 'm/4' pixels 210A corresponding to the data lines X(m/2+1) to X(3m/4), which is the half of the data lines X(m/2+1) to X(m) in the second block, in each row.

In the same manner, the power supply line pad 504 is formed with terminals of four power supply lines composed of three power supply lines and a ground line, the three power supply lines being connected to a power supply line of the pixel circuit 220 for each pixel 210A of R, G, and B included in 'm/4' pixels 210A corresponding to the data lines X(3m/4+1) to X(m), which is the other half of the data lines X(m/2+1) to X(m) in the second block, in each row.

The organic EL display device 1 shown in FIG. 1 includes the organic EL panel 2 having the above-described construction and four flexible wiring substrates connected to the panel. As the four flexible wiring substrates, two flexible wiring substrates 201 and 202 for data and two flexible wiring substrates 301 and 302 for power supply are provided.

The flexible wiring substrates 301 and 302 for power supply are provided with a plurality of power supply lines 301a and 302a which provide power to the pixel circuit 220 of each pixel 210A, respectively. The flexible wiring substrate 301 for power supply has one input-side terminal part 301b and two branched output-side terminal parts 301c and 301d. Similarly, the flexible wiring substrate 302 for power supply has one input-side terminal part 302b and two branched output-side terminal parts 302c and 302d.

On the other hand, driver ICs 103a and 103b, serving as data line driving circuits, which drive the data lines X1 to X(m/2) and X(m/2+1) to Xm in the two blocks, respectively, are mounted on the flexible wiring substrates 201 and 202 for data. In addition, the flexible wiring substrates 201 and 202 for data are provided with a plurality of input-side wiring lines 201a and 202a and a plurality of output-side wiring lines 201b and 202b, respectively.

As shown in FIGS. 1 and 2, the output-side terminal parts 301c and 301d of the flexible wiring substrate 301 for power supply are electrically connected to the power supply line pads 501 and 502, respectively, by being thermally pressed through an adhesive with an anisotropic conductive film. Similarly, the output-side terminal parts 302c and 302d of the flexible wiring substrate 302 for power supply are electrically connected to the power supply line pads 503 and 504, respectively, by being thermally pressed through an adhesive with an anisotropic conductive film.

On the other hand, as shown in FIGS. 1 and 2, the output-side terminal parts 201d and 202d of the flexible wiring substrates 201 and 202 for data are electrically connected to the data line pads 401 and 402, respectively, by being thermally pressed through an anisotropic conductive film.

In this way, as shown in FIG. 2, the flexible wiring substrate 301 for power supply and the flexible wiring substrate 201 for data are disposed to overlap each other, and the flexible wiring substrate 302 for power supply and the flexible wiring substrate 202 for data are disposed to overlap each other.

Further, the flexible wiring substrate 301 for power supply is shorter than the flexible wiring substrate 201 for data, the flexible wiring substrate 301 for power supply being positioned at the upper side with respect to the light-emitting element substrate 11 and the flexible wiring substrate 201 for data being positioned at the lower side with respect to the light-emitting element substrate 11 as compared with each other. Similarly, of the two flexible wiring substrates overlapping each other, the flexible wiring substrate 302 for power supply is shorter than the flexible wiring substrate 202 for data, the flexible wiring substrate 302 for power supply being positioned at the upper side with respect to the light-emitting element substrate 11 and the flexible wiring substrate 202 for data being positioned at the lower side with respect to the light-emitting element substrate 11 as compared with each other.

Furthermore, as shown in FIG. 2, the input-side terminal parts 301b and 302b of the flexible wiring substrates 301 and 302 for power supply are respectively inserted to connectors 125 and 126 provided on one surface 101a of a panel control substrate 101 so as to be electrically connected to a circuit provided on the panel control substrate 101. The panel control substrate 101 is provided with a panel control circuit 100 which outputs a control signal O, drive data P, and panel power Q as signals for performing display on the organic EL panel 2 by using a control signal, display image data, and a power signal supplied from an external circuit, respectively (see FIGS. 1 and 3). The panel control circuit 100 supplies the panel power Q to the plurality of power supply lines 301a and 302a, supplies the drive data P (driving signal) corresponding to the image data of each pixel to the plurality of input-side wiring lines 201a and 202a, and outputs the control signal 0 to control signal lines (not shown) of the flexible wiring substrates 201 and 202 for data.

On the other hand, the input-side terminal parts 201c and 202c of the flexible wiring substrates 201 and 202 for data are respectively inserted to connectors (not shown) provided on the other surface 101b of the panel control substrate 101 so as to be electrically connected to the panel control circuit 100.

As such, the input-side terminal parts 301b and 302b of the flexible wiring substrates 301 and 302 for power supply and the input-side terminal parts 201c and 202c of the flexible wiring substrates 201 and 202 for data are electrically connected to the connectors provided on different surfaces of the panel control substrate 101 on which the panel control circuit 100 is provided, respectively.

Next, the electrical configuration of the organic EL display device 1 including the organic EL panel 2 will be described with reference to FIGS. 3 and 4.

Figure 3:
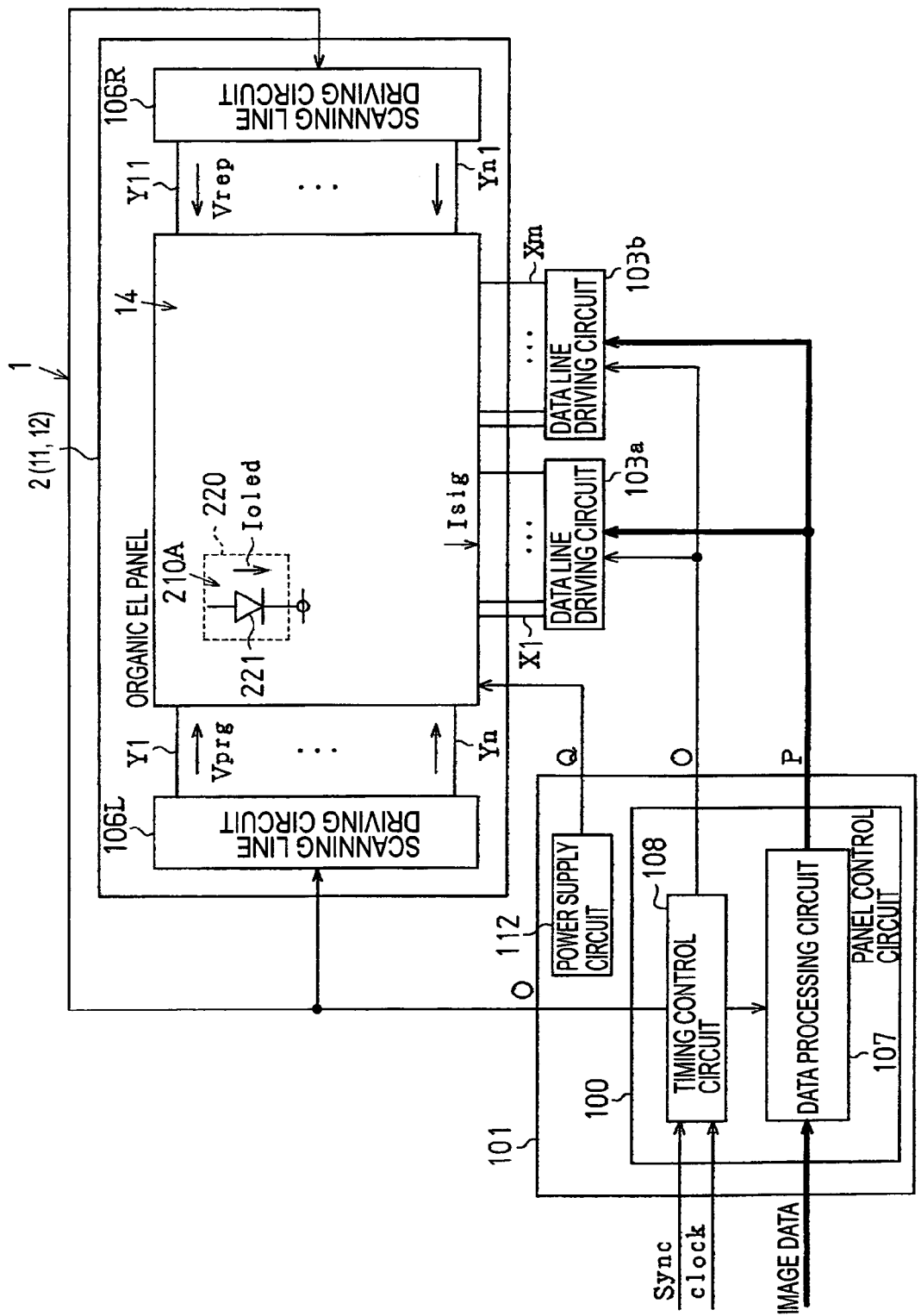
FIG. 3 is a block diagram illustrating the electrical configuration of the organic EL display device.

The organic EL display device 1 shown in FIG. 3 uses a current program system. The organic EL display device 1 includes the organic EL panel 2, the two driver ICs 103a and 103b serving as data line driving circuits, scanning line driving circuits 106L and 106R, and the panel control circuit 100.

As shown in FIG. 3, the organic EL panel 2 includes the plurality of pixels 210A arranged by 'n' rows by 'm' columns at intersections of 'n' first scanning lines Y1 to Yn (n is an integer) and 'm' data lines X1 to Xm (m is an integer), the first scanning lines Y1 to Yn extending in the row direction and the data lines X1 to Xm extending in the column direction. Further, the organic EL panel 2 includes 'n' second scanning lines Y11 to Yn1 extending in the row direction. As the plurality of pixels 210A, red pixels, green pixels, and blue pixels are arranged in the order of, for example, R, G, and B.

Further, the plurality of data lines X1 to Xm are divided into two blocks, and the data lines in each block are driven by the corresponding one of the two driver ICs 103a and 103b. The driver IC 103a drives the data lines X1 to X(m/2) and the driver IC 103b drives the data lines X(m/2+1) to X(m).

The scanning line driving circuit 106L sequentially generates and outputs a program period selection signal Vprg (see FIGS. 4A and 4B), having an H level, at a timing according to a synchronous signal Sync and a clock signal clock supplied from the outside, such that the first scanning lines Y1 to Yn are sequentially selected one by one by the line-sequential scanning operation. In FIG. 4B, only a program period (period from a time t1 to a time t2) during which the program period selection signal Vprg is output to the first scanning line Y1 at a first row among the first scanning lines Y1 to Yn is shown.

Further, the scanning line driving circuit 106R sequentially generates and outputs an emission period selection signal Vrep (see FIG. 4B) having an H level, at a timing according to the synchronous signal Sync and the clock signal clock supplied from the outside, such that the second scanning lines Y11 to Yn1 are sequentially selected one by one by the line-sequential scanning operation. In FIG. 4B, only an emission period (period from the time t2 to a time t3) during which the emission period selection signal Vrep having a high level is output to the second scanning line Y11 at a first row among the second scanning lines Y11 to Yn1 is shown. In addition, during the program period, the driver ICs 103a and 103b simultaneously supply the respective pixel circuits 220 connected to the one selected first scanning line with a program signal current Isig (see FIG. 4B) through the data lines X1 to Xm.

The program signal current Isig is a current signal obtained by performing a digital-to-analog converting operation for each image data of R, G, and B pixels in each of the driver ICs 103a and 103b, the image data of each pixel being digital gray-scale data, having 'n' bits, for gray-scale display. In the embodiment, the image data of each pixel 210A is a digital gray-scale data indicating the brightness of each pixel in an eight-bit binary number, and has one of the 256 gray-scale levels in a range of 0 to 255 gray-scale levels.

Figure 4A:
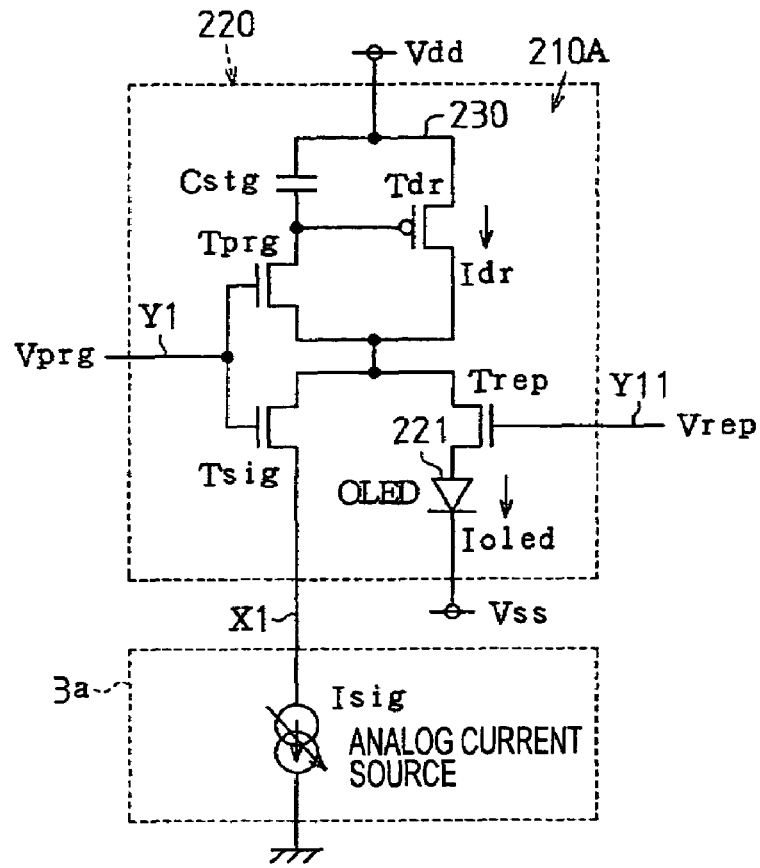
FIG. 4A is a circuit view illustrating a pixel circuit.
Figure 4B:
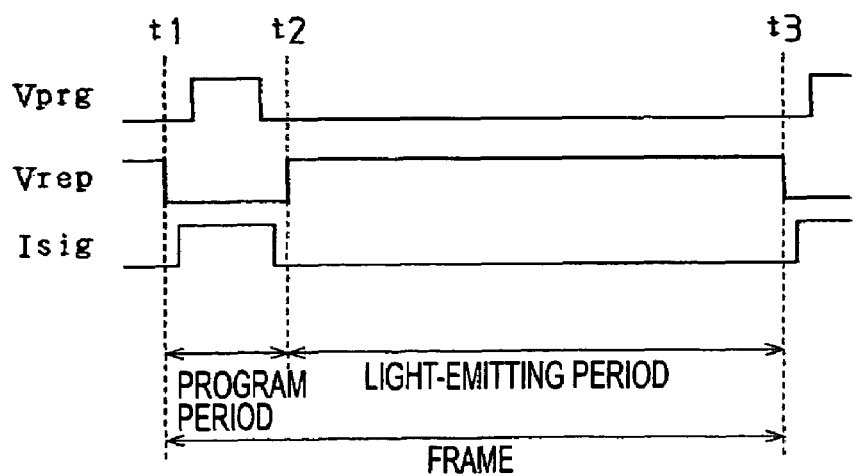
FIG. 4B is a timing chart illustrating an operation of the pixel circuit.

As shown in FIG. 4A, each of the driver ICs 103a and 103b includes a data writing circuit (sampling circuit) which writes the program signal current Isig onto each pixel circuit 220 through the corresponding data lines X1 to Xm, a shift register which controls the operation timing of the data writing circuit, a latch circuit, and a D/A (digital-to-analog) converter, and the like. In the latch circuit, image data for one row is held by storing the image data of each pixel in a data memory (not shown) provided for each pixel, and the image data stored in each data memory is simultaneously read so as to be output to the D/A converter during the program period.

In the present embodiment, even though two scanning line driving circuits are used, it is possible to drive the two blocks at the same time with one scanning line driving circuit.

Each pixel circuit 220 described above, such as the red, green, and blue pixels, includes the organic EL element 221 that emits one of the red, green, and blue colored light components from the light-emitting layer made of an organic semiconductor material. All pixel circuits 220 have the same circuit configurations except that the respective organic EL elements 221 emit different colored light.

The configuration of the pixel circuit 220 will be described with reference to FIG. 4A.

The pixel circuit 220 has a driving transistor Tdr, a program transistor Tprg, a transistor Tsig selected at a time of program execution, a transistor Trep selected at a time of emission, and a holding capacitor Cstg. The driving transistor Tdr is a p-channel TFT. The program transistor Tprg, the transistor Tsig selected at the time of program execution, and the transistor Trep selected at the time of emission are all N-channel TFTs.

A drain of the driving transistor Tdr is connected to an anode of the organic EL element 221 through the transistor Trep selected at the time of emission, and a cathode of the organic EL element 221 is grounded. In addition, the drain of the driving transistor Tdr is connected to one data line (data line X1 in FIG. 4A) through the transistor Tsig selected at the time of program execution. In addition, a source of the driving transistor Tdr is connected to a power supply line 230 from which a high-potential power source Vdd is supplied via one of the power supply lines. In reality, the power supply line connected to the power supply line 230 of each pixel circuit 220 is a thick strip-shaped power supply line provided individually for each pixel of R, G, and B (red pixel, green pixel, and blue pixel).

Further, a gate of the driving transistor Tdr is connected to a first electrode of the holding capacitor Cstg, and the second electrode of the holding capacitor Cstg is connected to the high-potential power source Vdd. The program transistor Tprg is connected between the gate and the drain of the driving transistor Tdr.

A gate of the transistor Tsig selected at the time of program execution and a gate of the program transistor Tprg are all connected to one (Y1 in FIG. 4A) of the first scanning lines. In addition, the transistor Tsig selected at the time of program execution and the program transistor Tprg are turned on in response to the program period selection signal Vprg, having an H level, supplied from the first scanning line Y1 and are turned off in response to the program period selection signal Vprg having an L level. Further, in the present embodiment, when the transistor Tsig selected at the time of program execution and the program transistor Tprg are turned on, the program signal current Isig is supplied to the data line X1.

A gate of the transistor Trep selected at the time of emission is connected to one (scanning line Y11 in FIG. 4A) of the second scanning lines. In addition, the transistor Trep selected at the time of emission is turned on in response to the emission period selection signal Vrep, having an H level, supplied from the second scanning line Y11 and are turned off in response to the emission period selection signal Vrep having an L level. Further, when the transistor Trep selected at the time of emission is turned on, a driving transistor supply current Idr while the driving transistor Tdr is turned on is supplied to the organic EL element 221 as an OLED supply current Ioled.

Next, an operation of each pixel circuit 220 will be briefly described with reference to FIG. 4B.

Program Period

When the program period selection signal Vprg having an H level is supplied from the first scanning line Y1, the program transistor Tprg and the transistor Tsig selected at the time of program execution are turned on. At this time, since the emission period selection signal Vrep having an L level is supplied from the second scanning line Y11, the transistor Trep selected at the time of emission is turned on. At this time, the program signal current Isig is supplied to the data line X1. Further, the program transistor Tprg is turned on, and thus the driving transistor Tdr has a diode connection. As a result, the program signal current Isig flows through a path including the driving transistor Tdr, the transistor Tsig selected at the time of program execution, and the data line X1 in this order. At this time, charges corresponding to the gate potential of the driving transistor Tdr are accumulated in the holding capacitor Cstg.

Emission Period

Subsequently, when the program period selection signal Vprg turns to an L level and the emission period selection signal Vrep turns to an H level, the program transistor Tprg and the transistor Tsig selected at the time of program execution are turned off and the transistor Trep selected at the time of emission is turned on. At this time, since the accumulated state of the charges of the holding capacitor Cstg does not change, the gate potential of the driving transistor Tdr is held at a voltage when the program signal current Isig flows therethrough. As a result, the driving transistor supply current Idr (OLED supply current Ioled) having an intensity according to the gate voltage of the driving transistor Tdr flows between the source and the drain of the driving transistor Tdr. More specifically, the OLED supply current Ioled flows through a path including the driving transistor Tdr, the transistor Trep selected at the time of emission, and the organic EL element 221 in this order. Thereby, the organic EL element 221 emits light having a brightness according to the OLED supply current Ioled (program signal current Isig).

The operation described above is sequentially performed for each of the pixel circuits 220 connected to the first scanning lines Y2 to Yn, respectively, and thus a display corresponding to one frame is realized.

As such, in the organic EL display device 1 according to the present embodiment, the plurality of pixels 210A arranged in a matrix is included, and the organic EL element 221 provided at each pixel 210A is driven on the basis of the image data of each of R, G, and B pixels, the image data being an eight-bit digital gray-scale data.

According to the first embodiment having the configuration described above, the following effects are obtained.

First, in the light-emitting element substrate 11, the power supply line pads 501 to 504 and the data line pads 401 and 402 are arranged in the two-dimensional manner. As such, since two types of pads, that is, the power supply line pads and the data line pads are not horizontally arranged side-by-side but arranged in the two-dimensional manner, it is possible to increase the number of data lines by increasing the length (width) of each of the data line pads 401 and 402, as compared with a case in which the two kinds of pads are horizontally arranged side-by-side. In addition, in the case in which one thick strip-shaped power supply line is assigned for each pixel of R, G, and B, it is possible to make the power supply line provided for each pixel thicker.

Further, by increasing the number of data lines, it is possible to improve the resolution due to an increased number of pixels, to make large the ratio of display area to the panel size in the direction in which the data lines are arranged, and to make the width (so-called frame width) of the non-display area narrow.

By making the width of the non-display area narrow, for example, in the case in which a plurality of display panels are disposed such that adjacent non-display areas of the display panels overlap each other and different images, such as an image of a speedometer, an image of a tachometer, or a map image of a navigation device in the vehicle, are displayed by the plurality of display panels, it is possible to perform display close to the display obtained by a typical meter.

Furthermore, since it is possible to make the power supply line provided for each pixel of R, G, and B thicker, it is possible to heighten the high brightness of the organic EL panel 2.

Further, it is possible to realize a high-resolution organic EL display panel in which the ratio of the display area to the panel size is large and the display having the high brightness can be performed.

Furthermore, since the power supply line pads 501 to 504 are disposed apart from the data line pads 401 and 402 and in the direction perpendicular to the lateral direction of the data line pads 401 and 402, it is possible to make the data line pads 401 and 402 extend as long as possible. As a result, it is possible to further increase the resolution and the brightness.

Second Embodiment

An organic EL panel 2A and an organic EL display device 1A using the same according to a second embodiment will be described with reference to FIG. 5.

In the organic EL panel 2A, a plurality of data lines X1 to Xm are divided into four blocks to be driven. For this reason, on a light-emitting element substrate 11 of the organic EL panel 2A, data line pads and power supply line pads are provided in the respective blocks. Specifically, four data line pads 401 to 404 and eight power supply line pads 501 to 508 are provided on the light-emitting element substrate 11, two of the eight power supply line pads 501 to 508 corresponding to each of the four data line pads 401 to 404. The power supply line pads 501 to 508 and the data line pads 401 to 404 are disposed in a two-dimensional manner as in the first embodiment.

Figure 5:
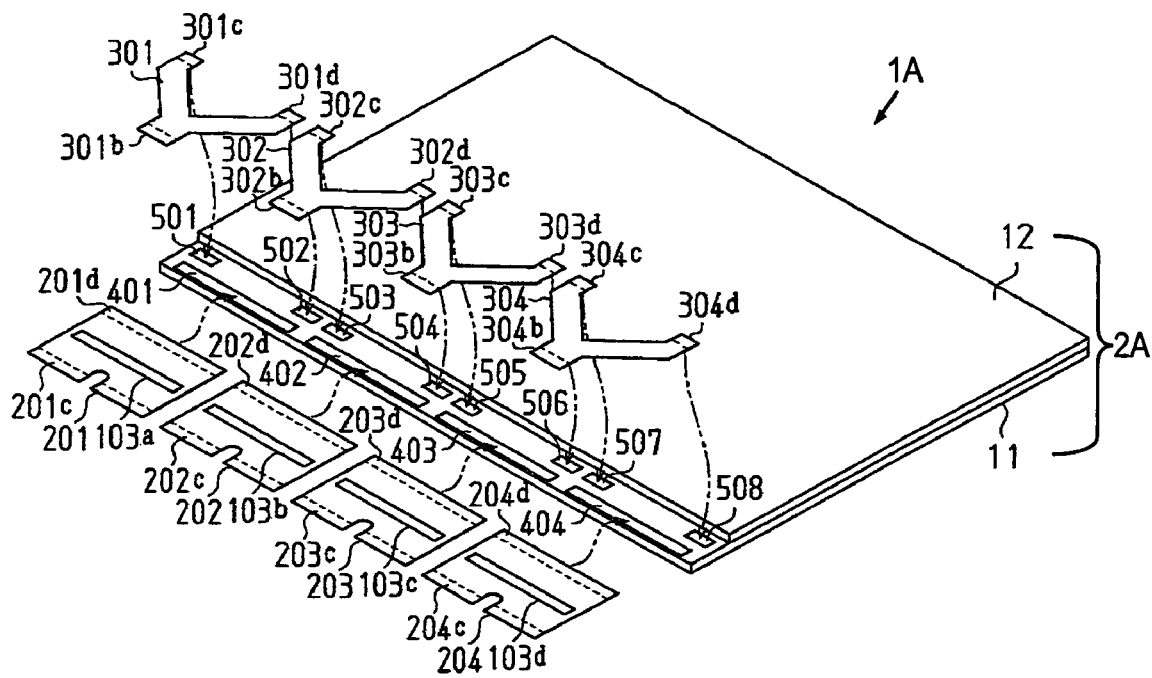
FIG. 5 is a perspective view illustrating an organic EL display device according to a second embodiment.

Flexible wiring substrates 303 and 304 for power supply shown in FIG. 5 have the same configuration as the flexible wiring substrates 301 and 302 for power supply described above. The flexible wiring substrate 303 for power supply has one input-side terminal part 303b and two branched output-side terminal parts 303c and 303d, and the flexible wiring substrate 304 for power supply has one input-side terminal part 304b and two branched output-side terminal parts 304c and 304d. The output-side terminal parts 303c and 303d of the flexible wiring substrate 303 for power supply are electrically connected to the power supply line pads 505 and 506, respectively, and the output-side terminal parts 304c and 304d of the flexible wiring substrate 304 for power supply are electrically connected to the power supply line pads 507 and 508, respectively. Further, the input-side terminal parts 303b and 304b of the flexible wiring substrates 303 and 304 for power supply are respectively inserted to connectors (not shown), such as the connectors 125 and 126 to which the input-side terminal parts 301b and 302b of the flexible wiring substrates 301 and 302 for power supply are connected.

On the other hand, driver ICs 103c and 103d, serving as data line driving circuits, which drive data lines in third and fourth blocks, respectively, are mounted on the flexible wiring substrates 203 and 204 for data, respectively, in the same manner as in the flexible wiring substrates 201 and 202 for data. In addition, the flexible wiring substrates 203 and 204 for data are provided with a plurality of input-side wiring lines (not shown) and a plurality of output-side wiring lines (not shown), respectively, in the same manner as in the flexible wiring substrates 201 and 202 for data. Further, the output-side terminal parts 203d and 204d of the flexible wiring substrates 203 and 204 for data are electrically connected to data line pads 403 and 404, respectively, in the same manner as the output-side terminal parts 201d and 202d of the flexible wiring substrates 201 and 202 for data. Furthermore, the input-side terminal parts 203c and 204c of the flexible wiring substrates 203 and 204 for data are respectively connected to connectors, such as the connectors to which the input-side terminal parts 201c and 202c of the flexible wiring substrates 201 and 202 for data are respectively connected.

According to the second embodiment having the configuration described above, the following effects in addition to the effects obtained in the first embodiment are obtained.

In a large organic EL panel having a large number of pixels at each row, it is possible to increase the resolution and the ratio of the display area to the panel size, and thus it is possible to heighten the high brightness of the panel.

Display Module of Movable Body

Figure 6:
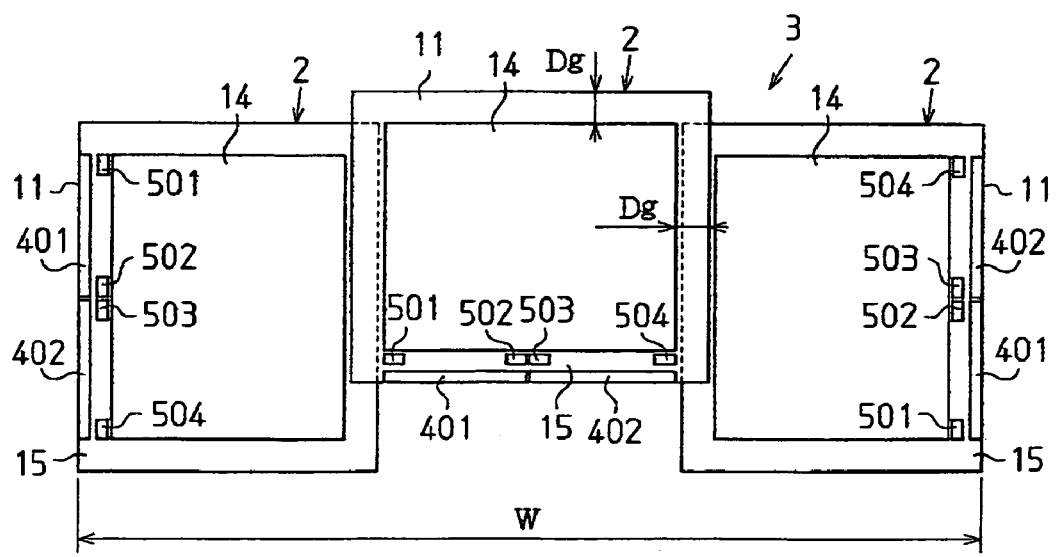
FIG. 6 is a panel arrangement view illustrating a display module of a movable body.
Figure 7:
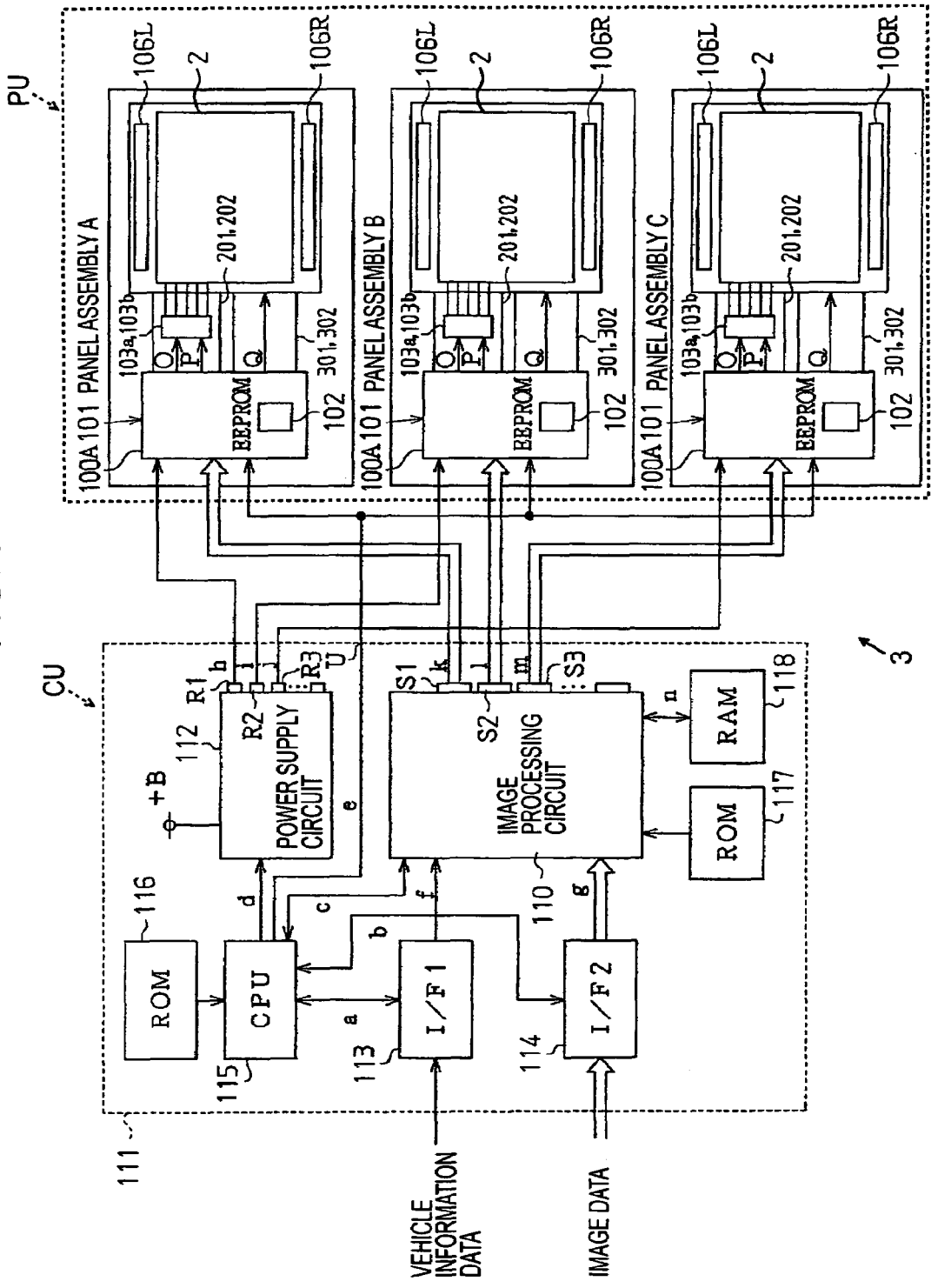
FIG. 7 is a block diagram illustrating the electrical configuration of the entire display module of the movable body.

Next, an embodiment of a display module of a movable body having the plurality of organic EL panels 2 will be described with reference to FIGS. 6 to 10. FIG. 6 illustrates the panel arrangement of the display module of the movable body, and FIG. 7 illustrates the electrical configuration of the entire display module. In addition, in the present embodiment, the display module of the movable body in which three above-described organic EL panels 2 shown in FIG. 1 are used will be described as an example.

As shown in FIG. 6, the display module 3 of the movable body includes the three organic EL panels 2, and one of the three organic EL panels 2 located in the middle of the display module is horizontally disposed and the other two organic EL panels 2 located at the left and right sides of the one organic EL panel 2 are vertically disposed.

As shown in FIG. 7, the display module 3 of the movable body includes three panel assemblies A, B, and C each having the organic EL panel 2. Further, the display module 3 of the movable body includes a panel unit PU having the three panel assemblies A, B, and C, and an image control unit CU. The image control unit CU generates a plurality of display image data items on the basis of image data and vehicle information data which are information data of the movable body, and includes a plurality of output ports R1, R2, R3, . . . , S1, S2, S3, . . . , and U which output the generated image data. The display module 3 of the movable body is configured such that each of the panel assemblies A, B, and C is electrically connected to the plurality of output ports of the image control unit CU and each of the three organic EL panels 2 performs different display on the basis of the plurality of display image data outputted from the plurality of output ports.

Figure 10:
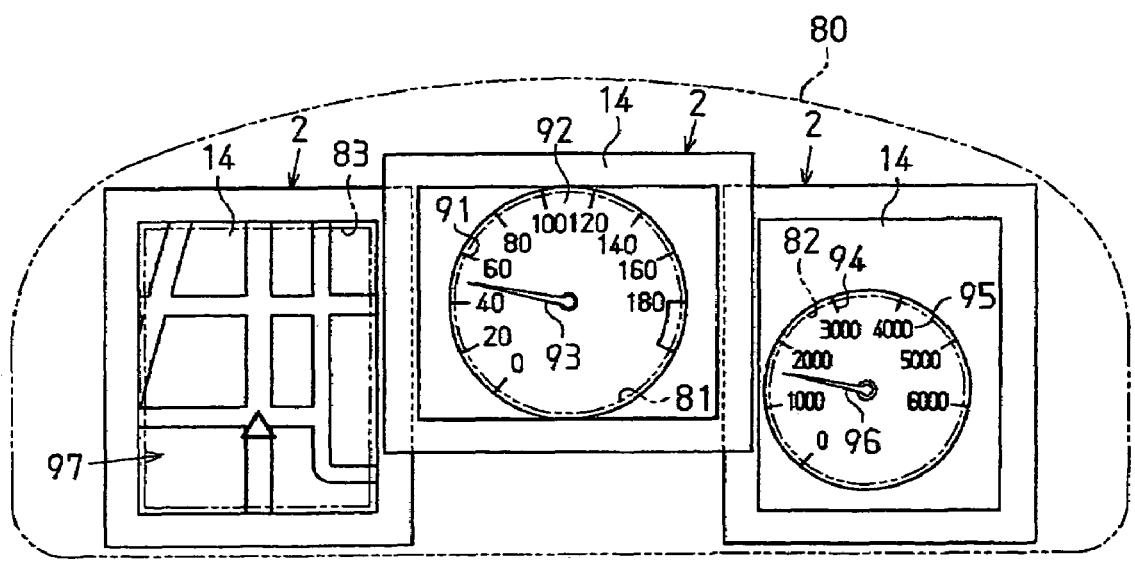
FIG. 10 is a plan view illustrating a display state of the display module.

Further, as a display example, as shown in FIG. 10, in the display module 3 of the movable body, a speedometer indicating the speed of a vehicle, such as a car, which is the movable body, is displayed on the middle organic EL panel 2, a tachometer indicating the engine rotation number is displayed on the right organic EL panel 2, and the map information of a car navigation device or the like is displayed on the left organic EL panel 2.

Electrical Configuration of a Panel Assembly

Figure 8:
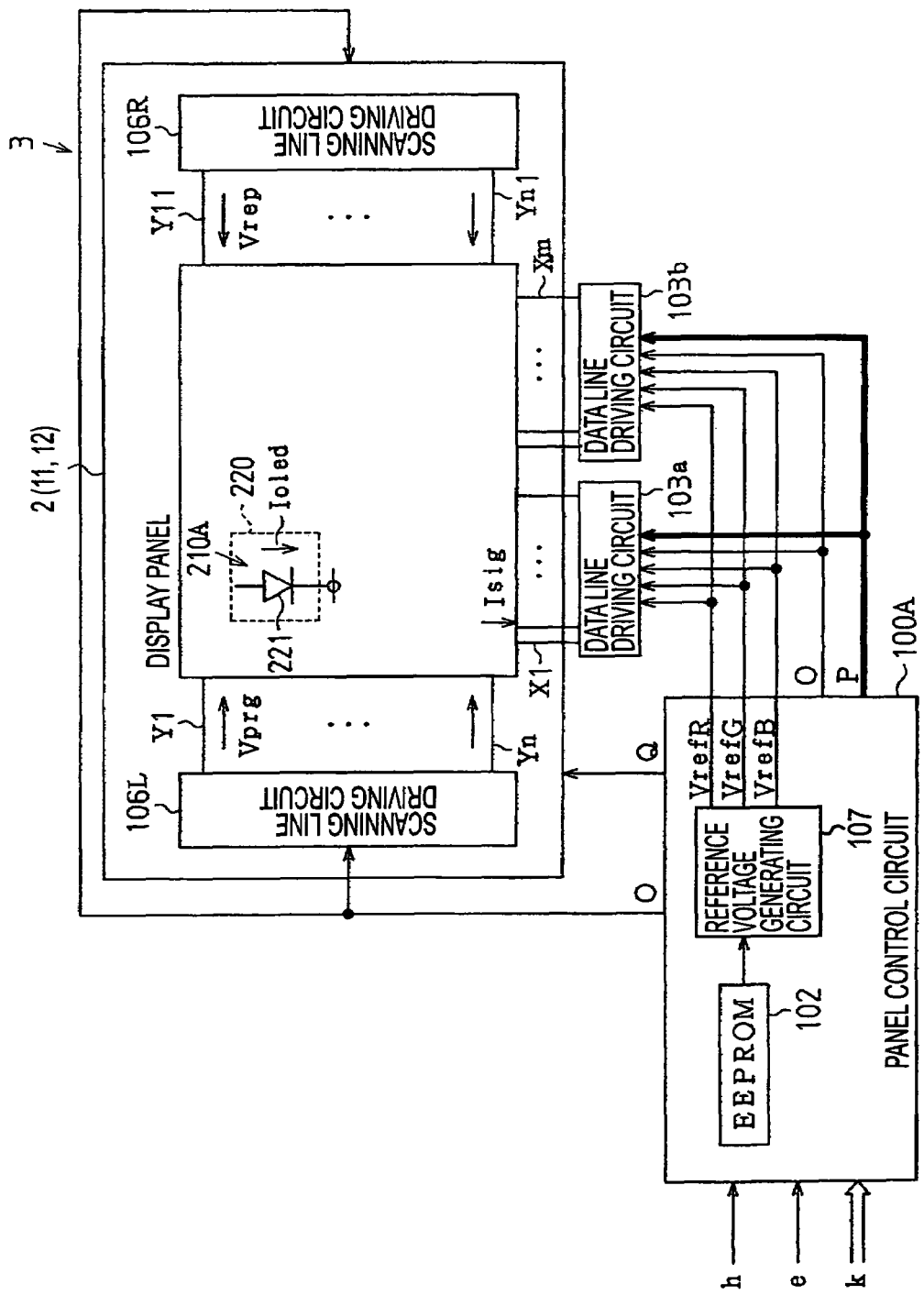
FIG. 8 is a block diagram illustrating the electrical configuration of a panel assembly in the display module of the movable body.

As shown in FIGS. 7 and 8, each of the panel assemblies A, B, and C includes a panel control substrate 101 provided with a panel control circuit 100A, the panel control circuit 100A performing display on each organic EL panel 2 by using the plurality of display image data items generated on the basis of the vehicle information data and the image data. In the embodiment, as an example, since an image processing circuit that performs an image processing on the vehicle information data and the image data or a power supply circuit is provided in the image control unit CU, each panel control circuit 100A performs display on each of the three organic EL panels 2 by using the plurality of display image data items supplied from the image control unit CU.

The panel control circuits 100A of the panel assemblies A, B, and C each include an EEPROM 102 serving as a storage unit storing brightness correction data for correcting the difference in the brightnesses of the three organic EL panels 2. In the display module 3 of the movable body, when power is supplied thereto, the brightness of each of the organic EL panels 2 is automatically adjusted by using the brightness correction data stored in each EEPROM 102.

Further, each panel control circuit 100A includes a plurality of output terminals that output control signal O, drive data P, and panel power Q, respectively, as signals for performing display on each organic EL panel 2 by using the plurality of display image data items supplied from the image control unit CU. The plurality of output terminals (not shown) is electrically connected to data lines, power supply lines, and control signal lines of each organic EL panel 2 through the flexible wiring substrates 201 and 202 for data mounted with the driver ICs 103a and 103b thereon and the flexible wiring substrates 301 and 302 for power supply.

The control signal O is a signal that controls the scanning line driving circuits 106L and 106R or the driver ICs 103a and 103b. In addition, the drive data P is image data of each pixel 210A (red pixel, green pixel, and blue pixel), for example, an eight-bit digital gray-scale data.

Electrical Configuration of Image Control Unit CU

Next, the electrical configuration of the image control unit CU will be described in detail with reference to FIG. 7. As shown in FIG. 10, as an example, in the display module 3 of the movable body of the present embodiment, scale marks 91, numeric characters 92, and a pointer 93 of the speedometer that displays the speed of a vehicle in an analog manner are displayed on the middle organic EL panel 2. Further, scale marks 94, numeric characters 95, and a pointer 96 of the tachometer that displays the engine rotation number in an analog manner are displayed on the right organic EL panel 2, and an image 97, such as the map information of the car navigation device, is displayed on the left organic EL panel 2. In the left organic EL panel 2, an image of a television or an image of a DVD device can also be displayed.

In the embodiment, the display module 3 of the movable body has one image control unit CU with respect to the three organic EL panels 2.

The image control unit CU includes an image control substrate 111 provided with an image processing circuit 110 that generates the plurality of display image data items on the basis of the vehicle information data and the image data to output the generated display image data to the panel control circuit 100A of each of the three panel assemblies A, B, and C.

Further, the image control unit CU includes a power supply circuit 112 that supplies power to each organic EL panel 2 through the plurality of output ports R1, R2, and R3, and a plurality of input circuits (interfaces I/F1 and I/F2) 113 and 114 to which the vehicle information data and the image data are input. Furthermore, the image control unit CU includes a CPU 115 that performs an overall control with respect to the image processing circuit 110, the power supply circuit 112, and the input circuits 113 and 114, a ROM 116 that stores various control programs, a ROM 117 that stores various image data items used in the image processing, and a RAM 118 for image processing.

In the ROM 117, background data for displaying the scale marks 91 and the numeric characters 92 of the speedometer and background data for displaying the scale marks 94, the numeric characters 95, and the pointer 96 of the tachometer are stored. Further, in the ROM 117, image data for generating the image of the pointer 93 arranged to overlap the scale marks 91 and the numeric characters 92 of the speedometer, image data for generating the image of the pointer 96 displayed to overlap the scale marks 94 and the numeric characters 95 of the tachometer, and the like are stored. A method of displaying the pointer 93 or the pointer 96 so as to overlap the background image may include the following two methods, and any other methods.

In a first method, multiple pointer data items (two types of pointer data items composed of indicating data for the pointer 93 and indicating data for the pointer 96) whose locations are different from one another by a predetermined angle are stored in the ROM 117, the pointer data according to the vehicle speed or the engine rotation number is read out, and the read pointer data and the background data are added to thus generate the display image data of each meter.

In a second method, the image data for each of the pointers 93 and 96 located at an angle according to the vehicle speed data or the engine rotation number is generated, and the generated image data for each pointer and the background data are added to thus generate the display image data of each meter.

To the input circuit 113, vehicle speed data for performing display on the speedometer by the middle organic EL panel 2 and engine rotation number data for performing display on the tachometer by the right organic EL panel 2 are input. The vehicle speed data detected by a vehicle speed sensor and the engine rotation number data detected by an engine rotation number sensor are sequentially transmitted from an ECU (electronic control unit) within the vehicle to the input circuit 113 through a network mounted on the vehicle. A CAN (controller area network), Flex Ray, or the like may be used as a network and protocol to be mounted in the vehicle.

To the input circuit 114, image data (image data for each of the pixels of R, G, and B), such as the map information, is input from the car navigation device mounted on the vehicle such as the car. In the embodiment, as an example, since a clock signal (synchronous signal) in addition to the image data is input to the input circuit 114, the scanning signals in each organic EL panel 2 are synchronized on the basis of the synchronous signal. In addition, the scanning in each organic EL panel 2 may be performed by receiving the clock signal (synchronous signal) from each organic EL panel 2 and then transmitting the image data from the image control unit CU to each of the panel assemblies A, B, and C. Moreover, image data supplied from other systems, such as a television or a video device, or image data supplied from storage units, such as an HDD or a DVD, may be input to the input circuit 114.

In the image control unit CU shown in FIG. 7, reference numerals a, b, c, d, e, f, and g denote a vehicle information data control signal, an image data control signal, an image processing circuit control signal, a power supply circuit control signal, a panel assembly control signal, vehicle information data, and image data, respectively. In addition, reference numerals h, i, j, k, l, and m denote a power signal supplied to the panel assembly A, a power signal supplied to the panel assembly B, a power signal supplied to the panel assembly C, image data supplied to the panel assembly A, image data supplied to the panel assembly B, and image data supplied to the panel assembly C, respectively. Reference numeral n denotes a control signal of the RAM 118.

The CPU 115 controls an operation of transmitting the vehicle information data f (vehicle speed data and engine rotation number data), which is sequentially input to the input circuit 113, to the image processing circuit 110, by using the vehicle information data control signal a. Further, the CPU 115 controls an operation of transmitting the image data, which is input to the input circuit 114, to the image processing circuit 110, by using the image data control signal g. Furthermore, the CPU 115 controls an operation of outputting the power signals h, i, and j from the output ports R1, R2, and R3 of the power supply circuit 112 to the panel assemblies A, B, and C, respectively, by using the power supply circuit control signal d. In addition, the CPU 115 controls an operation of outputting the image data k, l, and m from the output ports S1, S2, and S3 of the image processing circuit 110 to the panel assemblies A, B, and C, respectively, by using the image processing circuit control signal c. Moreover, the CPU 115 controls an operation of outputting the panel assembly control signal e to each of the panel assemblies A, B, and C.

Figure 9:
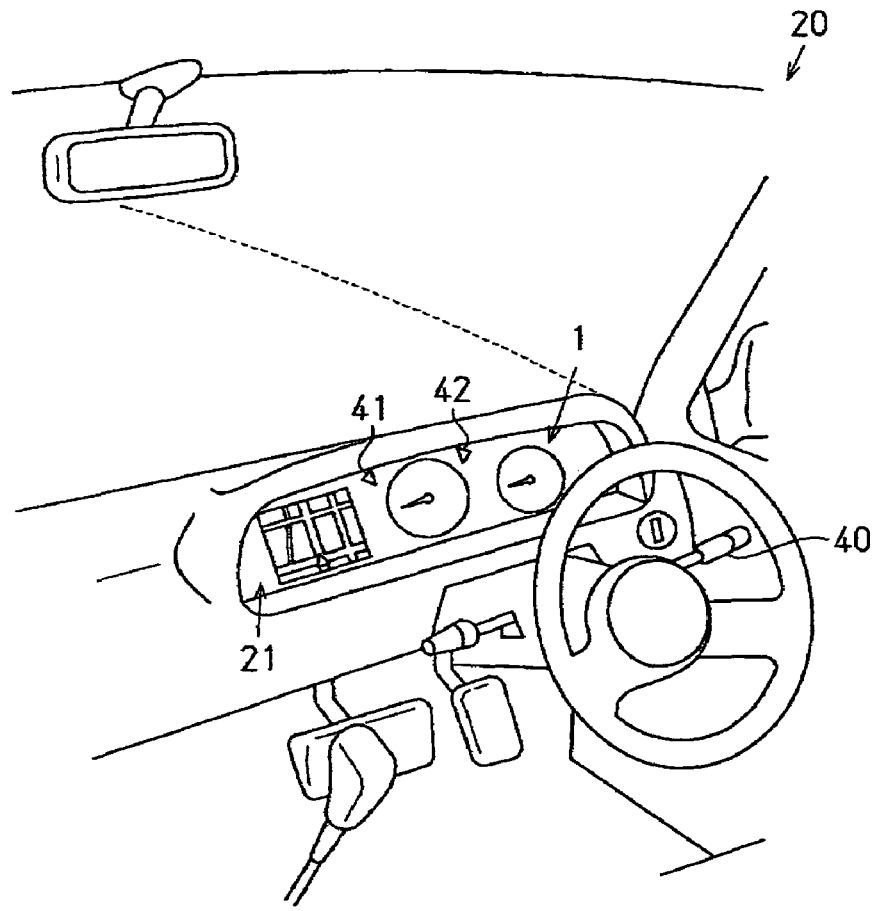
FIG. 9 is a perspective view illustrating the inside of a vehicle on which the display module is mounted.

As shown in FIG. 9, the display module 3 of the movable body having the configuration described above is mounted on an instrument panel 21 of a vehicle 20, such as a car. On left and right sides of a portion above the speedometer displayed by the middle organic EL panel 2, turn indicating parts 41 and 42 in which two light-emitting diodes blink by operating a turn indicator 40 in an up and down direction are provided, respectively. In each of the turn indicating parts 41 and 42, the two light-emitting diodes blink at the same time by an operation of a hazard switch (not shown).

According to the display module of the movable body having the configuration described above, the following effects are obtained.

Since the adjacent non-display areas 15 of the organic EL panels 2 overlap each other in plan view by using the three organic EL panels in which the widths of the non-display areas 15 can be made narrow, in the case in which different images, such as an image of the speedometer, an image of the tachometer, or a map image of the navigation device in the vehicle, are displayed by the three organic EL panels 2, it is possible to perform display close to the display obtained by a typical meter. In addition, with each of the three organic EL panels 2, it is possible to realize the display module 3 of the movable body in which the ratio of the display area 14 to the panel size is large and the display having high brightness can be performed.

Further, the invention may be modified as follows

Even though the organic EL panel 2 used in the organic EL display device 1 as a display panel has been described by way of an example in the embodiments, the invention may be applied to a display panel used for a fluorescent plasma display in which an electric discharge method is employed, or a display panel used for an SED (surface-conduction electron-emitter display) or an FED (field emission display) using an electron emission element, and in these cases, the same effects as in the embodiments can be obtained.

Figure 11A:
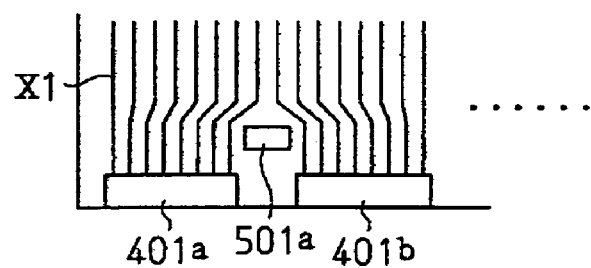
FIG. 11A is an explanatory view illustrating a modification of power supply line pads and data line pads.
Figure 11B:
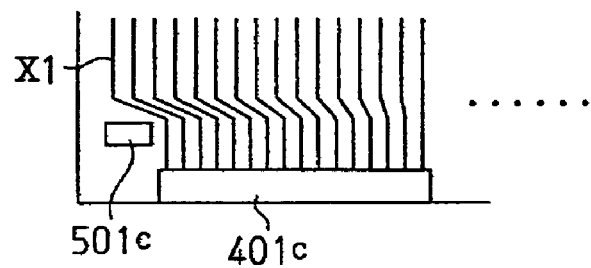
FIG. 11B is an explanatory view illustrating another modification of the power supply line pads and the data line pads.
Figure 12:
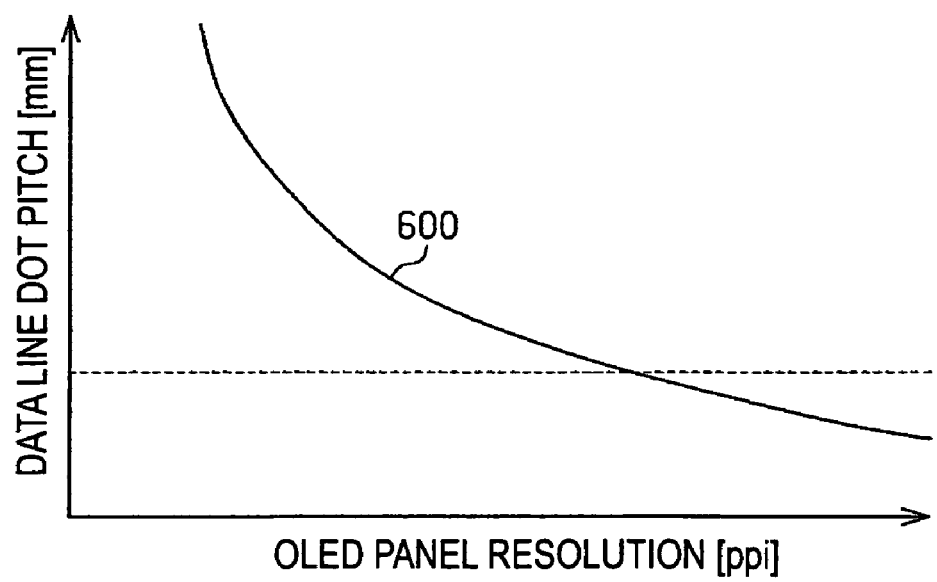
FIG. 12 is a graph illustrating a relationship between the resolution of the organic EL panel and the pitch between data line pads.

In the embodiments, on the light-emitting element substrate 11 of the organic EL panel 2, the data lines are divided into two blocks, and one data line pad and two power supply line pads are disposed for each of the blocks, as shown in FIG. 1. However, the invention is not limited thereto. For example, as shown in FIG. 11A, two data line pads 401a and 401b and one power supply line pad 501a may be disposed for each block. Alternatively, as shown in FIG. 11B, one data line pad 401c and one power supply line pad 501c may be disposed for each block. That is, the invention can be widely applied to the configuration in which a power supply line pad and a data line pad are disposed on the light-emitting element substrate 11 in a two-dimensional manner.

In the first embodiment, the data line pads 401 and 402 are horizontally disposed side-by-side at the end portion on the mounting side of the light-emitting element substrate 11 and the power supply line pads 501 to 504 are disposed more backward than the data line pads 401 and 402 as seen from the end portion on the mounting side of the light-emitting element substrate 11. On the contrary, the invention may be applied to the configuration in which the power supply line pads 501 to 504 are horizontally disposed side-by-side at the end portion on the mounting side of the light-emitting element substrate 11 and the data line pads 401 and 402 are disposed more backward than the power supply line pads 501 to 504. In this case, the four power supply line pads 501 to 504 are disposed at the end portion on the mounting side of the light-emitting element substrate 11 in the same manner as in FIG. 1.

Similarly, the invention may be applied to the configuration in which the eight power supply line pads 501 to 508 are disposed at the end portion on the mounting side of the light-emitting element substrate 11 in the same manner as in FIG. 5 and the four data line pads 401 to 404 are disposed more backward than the power supply line pads 501 to 508, as in the second embodiment.

Even though the data lines are divided into two blocks and two driver ICs drive the data lines in the divided blocks, respectively, in the first embodiment, and the data lines are divided into four blocks and four driver ICs drive the data lines in the divided blocks, respectively, in the second embodiment; however, the invention is not limited to those configurations. For example, the invention may be applied to the configuration in which the data lines are divided into blocks other than the 'two' or 'four' blocks.

Further, in the embodiments, the configuration in which the data lines X1 to Xm are divided into a plurality of blocks has been described by way of an example. However, the invention may also be applied to the configuration in which the data lines X1 to Xm are driven by one data line driving circuit (driver IC).

Furthermore, in the first embodiment, the power supply line connected to the power supply line 230 of each pixel circuit 220 is a thick strip-shaped power supply line provided individually for each pixel of R, G, and B. However, the invention may also be applied to the configuration in which a plurality of power supply lines, for example, 20 to 30 power supply lines are provided for each pixel.

What is claimed is:

1. A display panel comprising:
a light-emitting element substrate provided with a plurality of pixels that are arranged in a matrix corresponding to intersections of a plurality of scanning lines and a plurality of data lines, the light-emitting element substrate including an edge to one side of the matrix;
light-emitting elements provided in correspondence with the pixels and driven on the basis of image data; and
a power supply line pad and a data line pad that are disposed between the edge and the matrix of the light-emitting element substrate, the power supply line pad and the data line pad being not aligned in a direction following the edge of the light-emitting element substrate, the power supply line pad including terminals of a plurality of power supply lines that supply power to the pixels and the data line pad including terminals of the plurality of data lines.

2. The display panel according to claim 1, further comprising:
- a flexible wiring substrate for power supply including an output-side terminal part that is electrically connected to the power supply line pad; and
- a flexible wiring substrate for data including an output-side terminal part that is electrically connected to the data line pad.

3. The display panel according to claim 2, further comprising:
- a sealing substrate connected to the light-emitting element substrate so as to seal the plurality of pixels,
- wherein the data line pad is formed on the light-emitting element substrate by using the entire area between left and right sealing areas, each having a width necessary for the sealing substrate.

4. The display panel according to claim 1,
- wherein the plurality of data lines are divided into a plurality of blocks, and further comprising:
- a plurality of power supply line pads and a plurality of data line pads provided for the plurality of blocks.

5. A display device comprising:
- a display panel having a light-emitting element substrate provided with a plurality of pixels that are arranged in a matrix corresponding to intersections of a plurality of scanning lines and a plurality of data lines, the light-emitting element substrate including an edge to one side of the matrix;
- a light-emitting element provided at each of the pixels that is driven on the basis of image data;
- a power supply line pad and a data line pad that are disposed over the light-emitting element substrate, the power supply line pad and the data line pad not being aligned in a direction following the edge of the light-emitting element substrate, the power supply line pad being provided with terminals of a plurality of power supply lines that supply the power to the pixels and the data line pad being provided with terminals of the plurality of data lines;
- a flexible wiring substrate for power supply including an output-side terminal part that is electrically connected to the power supply line pad, the flexible wiring substrate for power supply being provided with a plurality of power supply lines that supply the power to the respective pixels;
- a flexible wiring substrate for data including an output-side terminal part that is electrically connected to the data line pad the flexible wiring substrate for data being provided with a plurality of wiring lines that supply driving signals to the plurality of data lines; and
- a driver IC that drives the plurality of data lines, the driver IC being mounted on the flexible wiring substrate for data.

6. The display device according to claim 5,
- wherein the flexible wiring substrate for power supply and the flexible wiring substrate for data overlap each other.

7. The display device according to claim 6,
- wherein one of the flexible wiring substrate for power supply and the flexible wiring substrate for data is shorter than the other and is positioned at the upper side with respect to the light-emitting element substrate.

8. The display device according to claim 7,
- wherein the plurality of power supply lines is supplied with power from an input-side terminal part of the flexible wiring substrate for power supply and an input-side terminal part of the flexible wiring substrate for data, and
- the input-side terminal part of the flexible wiring substrate for power supply and the input-side terminal part of the flexible wiring substrate for data are connected to different surfaces of a panel control substrate provided with a panel control circuit, the panel control circuit supplying the plurality of wiring lines with a driving signal corresponding to image data of each of the pixels.

9. A display module of a movable body comprising:
- the plurality of display panels according to claim 1,
- wherein adjacent panels of the plurality of display panels are disposed such that non-display areas around the peripheries of display areas of the adjacent display panels overlap each other in plan view, each of the display areas being arranged with a plurality of pixels each having an electroluminescent element in a two-dimensional manner.

10. A display panel comprising:
- a light-emitting element substrate provided with a plurality of pixels that are arranged in a matrix corresponding to intersections of a plurality of scanning lines and a plurality of data lines;
- a light-emitting element provided at each of the pixels that is driven on the basis of image data;
- a power supply line pad and a data line pad that are disposed on the light-emitting element substrate in a two-dimensional manner, the power supply line pad being provided with terminals of a plurality of power supply lines that supply the power to the pixels and the data line pad being provided with terminals of the plurality of data lines,
- wherein the power supply line pad is disposed apart from the data line pad in the direction perpendicular to the lateral direction of the data line pad; and a sealing substrate connected to the light-emitting element substrate so as to seal the plurality of pixels,
- wherein the data line pad is formed on the light-emitting element substrate by using the entire area between left and right sealing areas, each having a width necessary for the sealing substrate.

* * * * *